(12) United States Patent
Alenin et al.

(10) Patent No.: US 7,554,364 B2
(45) Date of Patent: Jun. 30, 2009

(54) HIGH-VOLTAGE OPERATIONAL AMPLIFIER INPUT STAGE AND METHOD

(75) Inventors: Sergey V. Alenin, Tucson, AZ (US);
Junlin Zhou, Tucson, AZ (US)

(73) Assignee: Texas Instruments Incorporated,
Dallas, TX (US)

( * ) Notice: Subject to any disclaimer, the term of this patent is extended or adjusted under 35 U.S.C. 154(b) by 0 days.

(21) Appl. No.: 11/901,847

(22) Filed: Sep. 19, 2007

(65) Prior Publication Data

US 2008/0068081 A1 Mar. 20, 2008

Related U.S. Application Data

(63) Continuation-in-part of application No. 11/353,186, filed on Feb. 13, 2006, now Pat. No. 7,339,402.

(51) Int. Cl.
*H03K 19/08* (2006.01)
*H03K 19/00* (2006.01)

(52) U.S. Cl. .................. 326/109; 326/112; 330/253

(58) Field of Classification Search .......... 326/109, 326/112, 83; 330/252, 253; 327/560–563
See application file for complete search history.

(56) References Cited

U.S. PATENT DOCUMENTS

| 6,359,512 B1 | 3/2002 | Ivanov et al. | 330/255 |
| 6,437,645 B1 | 8/2002 | Ivanov et al. | 330/255 |
| 7,084,704 B2 * | 8/2006 | Sowlati | 330/253 |

* cited by examiner

*Primary Examiner*—Daniel D Chang
(74) *Attorney, Agent, or Firm*—Jon J. Patti; Wade J. Brady, III; Frederick J. Telecky, Jr.

(57) ABSTRACT

Circuitry for preventing damage to differentially coupled input JFETs in an integrated circuit amplifier includes first (J2) and second (J4) differentially coupled input JFETs. A first input signal (Vin+) is applied to a gate of the first input JFET (J2), and second input signal (Vin−) is applied to a gate of the second input JFET. Needed amounts of drain current are supplied to the first and second input JFETs. A separator JFET (J1) having a drain coupled to a source of the first input JFET and a source coupled to the source of the second input JFET is operated to control an amount of electrical isolation between the drain and source of the separator JFET so as to limit an amount of reverse bias voltage across a gate-source junction of one of the first and second input JFETs to a value less than a gate-source junction breakdown voltage of that the first and second input JFETs.

18 Claims, 2 Drawing Sheets

HIGH-VOLTAGE OPERATIONAL AMPLIFIER INPUT STAGE AND METHOD

CROSS REFERENCE TO RELATED APPLICATION

This application is a continuation-in-part of commonly assigned patent application Ser. No. 11/353,186 filed on Feb. 13, 2006, now U.S. Pat. No. 7,339,402 entitled "Differential Amplifier with Over-Voltage Protection and Method", by Alenin et al., and incorporated herein by reference.

BACKGROUND OF THE INVENTION

The present invention relates generally to amplifiers, particularly to input stages for high-voltage operational amplifiers which are subject to high differential voltages, and more particularly to such input stages which utilize low voltage differential input transistors.

The design of conventional differential amplifiers is well known. A typical input stage includes one or more pairs of differentially coupled input JFETs (junction field effect transistors) and associated current sources. For high voltage amplifier design, so-called high voltage transistors, which have high breakdown voltage parameters that are not exceeded during normal circuit operation, are typically used as the input transistors in order to accommodate high input voltages to which the input transistors may be subjected. So-called "low-voltage transistors" have lower breakdown voltage parameters which can be exceeded by internal node voltages in the integrated circuit input stage. For example, in some integrated circuit manufacturing processes, low-voltage N-channel JFETs can be damaged by a relatively low gate-to-source low breakdown voltage of 10 volts. High-voltage transistors usually have higher threshold voltage, higher parasitic capacitances, etc., than low-voltage transistors. The higher threshold voltages, high parasitic capacitances, etc., limit the design flexibility and the amplifier performance parameters such as bandwidth, slew rate, settling time.

Referring to FIG. 1, a conventional input circuit 1 includes input conductors 2 and 3 to which input voltages Vin$^+$ and Vin$^-$, respectively, are applied. Conductor 2 is coupled by input resistor R1 to conductor 5, which is connected to the gate of a low-voltage N-channel JFET J0, the anode of a clamp diode D0, and the cathode of a clamp diode D2. Conductor 3 is coupled by input resistor R0 to conductor 6, which is connected to the gate of a low-voltage N-channel JFET J1, the anode of a clamp diode D3, and the cathode of a clamp diode D1. The sources of input JFETs J0 and J1 are coupled by conductor 4 to a tail current source I1. The drain of input transistor J0 is connected by conductor 7 to the emitter of an NPN cascode transistor Q3. The drain of input transistor J1 is connected by conductor 8 to the emitter of an NPN cascode transistor Q4. The bases of cascode transistors Q3 and Q4 are coupled to a bias voltage. The collector of cascode transistor Q3 is connected by conductor 9 to the base and collector of a PNP current mirror input transistor Q5, the emitter of which is coupled to $V_{DD}$. The collector of cascode transistor Q4 is connected by an output conductor 10 to the collector of a PNP current mirror output transistor Q6. The base of current mirror output transistor Q6 is connected to the base of transistor Q5 and its emitter is connected to $V_{DD}$.

By way of definition, is to be understood that a JFET has two current-carrying electrodes, and that each of those two current-carrying electrodes can function interchangeably as either a source or a drain of the JFET, depending on which one is at the highest voltage relative to the other. For example, in an N-channel JFET, the current-carrying electrode which is at the higher voltage is the drain and the other current-carrying electrode is the source of the JFET. For example, if the voltage of a first current-carrying electrode of a N-channel JFET initially functions as its drain but then goes to a voltage which is lower than that of its second current-carrying electrode, then the second current-carrying electrode becomes the drain and the first current-carrying electrode becomes the source.

In input stage 1 of FIG. 1, low voltage input JFETs J0 and J1, rather than high-voltage input transistors, may be used as the input differential transistor pair in order to meet a desired amplifier bandwidth, slew rate, and/or settling time requirement. The low-voltage input JFETs J0 and J1 need to be fully protected against applied high input voltages. A typical input transistor protection circuit includes the back-to-back diode clamps D0, D1, D2, and D3 as shown in FIG. 1 to prevent the gate-to-source and drain-to-source voltages of various transistors from going high enough to reach their respective breakdown voltage levels. (The same approach can be used to prevent base-to-emitter and/or collector-to-emitter voltages of low-voltage NPN or PNP input transistors from going high enough to reach the various transistor breakdown voltage levels.) However, there is a potential problem with the technique shown in FIG. 1 for protecting the input transistors. When the differential input voltage is sufficiently high, under either DC or transient conditions, the various protection diodes D0-3 are turned on so as to clamp or limit the voltage differences between conductors 5 and 6. As a result, the diode current flows thought the input conductors 2 and 3 of input stage 1. This diode current is usually large (e.g., a milliampere or more, depending on the diode size and the size of input current limiting resistors R1 and R0), and is not acceptable in certain applications.

Various circuits are known for boosting the slew rate of an amplifier, including commonly owned U.S. Pat. No. 6,359,572 entitled "Slew Rate Boost Circuitry and Method", issued on Mar. 19, 2002 to Ivanov et al., and commonly owned U.S. Pat. No. 6,437,645 entitled "Slew Rate Boost Circuitry and Method", issued on Aug. 20, 2002 to Ivanov et al.

Thus, there is an unmet need for a high-voltage amplifier input stage and method which utilizes low-voltage input transistors and which also has approximately the same performance as if high-voltage input transistors are used.

There also is an unmet need for a high-voltage amplifier input stage and method which utilizes low-voltage input transistors and which also has approximately the same performance as if high-voltage input transistors are used instead of low-voltage input transistors.

There also is an unmet need for a high-voltage amplifier input stage and method which utilizes low-voltage input transistors and does not require use of clamp diodes to prevent damage to the low-voltage input transistors when high magnitude differential input voltages are applied between inputs of the input stage.

There also is an unmet need for a high-voltage amplifier input stage having a simple slew rate enhancement capability.

SUMMARY OF THE INVENTION

It is an object of the invention to provide a high-voltage amplifier input stage and method which utilizes low-voltage input transistors and which also has approximately the same performance as if high-voltage input transistors are used.

It is another object of the invention to provide a high-voltage amplifier input stage and method which utilizes low-voltage input transistors and which also has approximately the same performance as if high-voltage input transistors are used instead of low-voltage input transistors.

It is another object of the invention to provide a high-voltage amplifier input stage and method which utilizes low-voltage input transistors and does not require use of clamp diodes to prevent damage to the low-voltage input transistors when high magnitude differential input voltages are applied between inputs of the input stage.

It is another object of the invention to provide a high-voltage amplifier input stage having a simple slew rate enhancement capability.

Briefly described, and in accordance with one embodiment, the present invention provides circuitry for preventing damage to differentially coupled input JFETs in an integrated circuit amplifier includes first (J2) and second (J4) differentially coupled input JFETs. A first input signal (Vin+) is applied to a gate of the first input JFET (J2), and second input signal (Vin−) is applied to a gate of the second input JFET. Needed amounts of drain current are supplied to the first and second input JFETs. A separator JFET (J1) having a drain coupled to a source of the first input JFET and a source coupled to the source of the second input JFET is operated to control an amount of electrical isolation between the drain and source of the separator JFET so as to limit an amount of reverse bias voltage across a gate-source junction of one of the first and second input JFETs to a value less than a gate-source junction breakdown voltage of that the first and second input JFETs.

In one embodiment, the invention provides an input stage (15) including a differentially coupled first (J2) and second (J4) input JFETs (junction field-effect transistors), a gate of the first input JFET (J2) being coupled to receive a first input signal (Vin+) and a gate of the second input JFET (J4) being coupled to receive a second input signal (Vin−). A first active current source transistor (Q14) is coupled between a first reference voltage ($V_{DD}$) and a drain of the first input JFET (J2), and a second active current source transistor (Q15) is coupled between the first reference voltage ($V_{DD}$) and a drain of the second input JFET (J4). A separator JFET (J1) has a drain coupled to a source of the first input JFET (J2) and a source coupled to a source of the second input JFET (J4). A control circuit (Q11,D0,D1) has a first input coupled to the drain (16) of the first input JFET (J2), a second input coupled to the drain (36) of the second input JFET (J4), and an output (28) coupled to a gate of the separator JFET (J1) for controlling the separator JFET (J1) in response to the first (Vin+) and second (Vin−) input signals so as to limit a reverse bias voltage across a gate-source junction of one of the first (J2) and second (J4) input JFETs. A bias current circuitry (I1,I8) is coupled to bias the first (J2) and second (J4) input JFETs, respectively.

In a described embodiment, the control circuit includes a first diode (D0) having an anode coupled to the drain of the first input JFET (J2) and a cathode coupled to a base of a level shift transistor (Q11) having an emitter coupled to the gate of the separator JFET (J1). A second diode (D1) has an anode coupled to the drain of the second input JFET (J4) and a cathode coupled to the base of the level shift transistor (Q11). The first (J2) and second (J4) input JFETs are low-voltage JFETs having gate-source breakdown voltages which are less than a predetermined maximum magnitude of a difference between the first input signal ($Vin^+$) and the second input signal ($Vin^-$). A first transistor (Q0) has an emitter coupled to the source of the first input JFET (J2), a base coupled to the drain of the separator JFET (J1), and a collector coupled to conduct a first output signal ($Vout^+$). A second transistor (Q5) has an emitter coupled to the source of the second input JFET (J4), a base coupled to the source of the separator JFET (J1), and a collector coupled to conduct a second output signal ($Vout^-$). A first current source (I1) in the bias current circuitry is coupled between the source of the first input JFET (J2) and a second reference voltage (GND), and a second current source (I8) in the bias current circuitry is coupled between the source of the second input JFET (J4) and the second reference voltage (GND).

In a described embodiment, a first JFET (J0) has a gate and a drain coupled to the gate and drain, respectively, of the first input JFET (J2). A second JFET (J3) has a gate and a drain coupled to the gate and drain, respectively, of the second input JFET (J4), a third transistor (Q2) has a base and collector coupled to the drain of the separator JFET (J1) and to a third current source (I5) and an emitter coupled to a source of the first JFET (J0), and a fourth transistor (Q4) has a base and collector coupled to the source of the separator JFET (J1) and to a fourth current source (I6) and an emitter coupled to a source of the second JFET (J3). A fifth transistor (Q9) has an emitter coupled to the drain of the first JFET (J0) and a base coupled to the source of the first JFET (J0) for maintaining the drain of the first JFET (J0) and the drain of the first input JFET (J2) at a voltage that is one base-emitter voltage ($V_{BE}$) plus one source-gate voltage ($V_{SG}$) different from the first input voltage ($Vin^+$). A sixth transistor (Q13) has an emitter coupled to the drain of the second JFET (J3) and a base coupled to the source of the second JFET (J3) for maintaining the drains of the second JFET (J3) and the second input JFET (J4) at a voltage that is one base-emitter voltage ($V_{BE}$) plus one gate-source voltage ($V_{GS}$) different from the second input voltage ($Vin^-$). A seventh transistor (Q6) has a collector coupled to a base of the first active current source transistor (Q14) to a fifth current source (I3), and an emitter coupled to a collector of the fifth transistor (Q9) and to one terminal of a first resistor (R4). An eighth transistor (Q7) has a collector coupled to a base of the second active current source transistor (Q15), to a sixth current source (I11), and an emitter coupled to a collector of the sixth transistor (Q13) and to one terminal of a second resistor (R8).

In a described embodiment, the source of the first JFET (J0) is coupled by means of a third resistor (R0) to a fifth current source (I0) and to a first terminal of a fourth resistor (R1) having a second terminal coupled to an emitter of the third transistor (Q2). The source of the second JFET (J3) is coupled by means of a fifth resistor (R2) to a sixth current source (I9) and to a first terminal of a sixth resistor (R3) having a second terminal coupled to an emitter of the fourth transistor (Q4).

In the described embodiment, the first (J2) and second (J4) input JFETs are N-channel JFETs, the first (Q0), second (Q5), third (Q2), and fourth (Q4) transistors are NPN transistors, the fifth (Q9) and sixth (Q13) transistors are PNP transistors, and the first (Q14) and second (Q15) active current source transistors are PNP transistors. The seventh (Q6) and eighth (Q7) transistors are NPN transistors, and the first (J0) and second (J3) JFETs are low-voltage JFETs.

In the described embodiment, the first through the eighth transistors have emitter-base breakdown voltages of no more than approximately 3 volts.

In one embodiment, the invention provides a method for preventing damage to differentially coupled input JFETs in an integrated circuit amplifier, including providing first (J2) and second (J4) differentially coupled input JFETs, applying a first input signal (Vin+) to a gate of the first input JFET (J2), and applying a second input signal (Vin−) to a gate of the second input JFET (J4), supplying needed amounts of drain current to the first (J2) and second (J4) input JFETs, and operating a separator JFET (J1) having a drain coupled to a source of the first input JFET (J2) and a source coupled to a source of the second input JFET (J4) to control an amount of electrical isolation between the drain and source of the separator JFET (J1) so as to limit an amount of reverse bias voltage across a gate-source junction of one of the first (J2) and second (J4) input JFETs to a value of less than a gate-source junction breakdown voltage of that one of the first (J2) and second (J4) input JFETs.

In one embodiment, the method includes providing a first transistor (Q0) having an emitter coupled to the source of the first input JFET (J2), a base coupled to the drain of the separator JFET (J1), and a collector coupled to conduct a first output signal (Vout+), a second transistor (Q5) having an emitter coupled to the source of the second input JFET (J4), a base coupled to the source of the separator JFET (J1), and a collector coupled to conduct a second output signal (Vout−), a first current source (I1) coupled between the source of the first input JFET (J2) and a second reference voltage (GND), and a second current source (I8) coupled between the source of the second input JFET (J4) and the second reference voltage (GND), and operating the first (J2) and second (J4) input JFETS, the first (Q0) and second (Q5) transistors, the first (I1) and second (I8) current sources so as to cause a larger portion of current of the first current source (I1) to flow through the first transistor (Q0) when the first input signal (Vin+) causes in amount of current through the first input JFET (J2) to decrease substantially and so as to cause a larger portion of current of the second current source (I8) to flow through the second transistor (Q5) when the second input signal (Vin−) causes in amount of current through the second input JFET (J4) to decrease substantially, to thereby provide slew boosting in the integrated circuit amplifier. In one embodiment the method includes coupling the base of the first transistor (Q0) to the drain of the separator JFET (J1) and coupling the base of the second transistor (Q5) to the source of the separator JFET (J1).

In one embodiment, needed amounts of drain current are supplied by providing a first active current source transistor (Q14) coupled between a first reference voltage ($V_{DD}$) and a drain of the first input JFET (J2), and a second active current source transistor (Q15) coupled between the first reference voltage ($V_{DD}$) and a drain of the second input JFET (J4).

In one embodiment, the invention provides circuitry for preventing damage to differentially coupled input JFETs in an integrated circuit amplifier, including first (J2) and second (J4) differentially coupled input JFETs, means (2,3) for applying a first input signal (Vin+) to a gate of the first input JFET (J2), and applying a second input signal (Vin−) to a gate of the second input JFET (J4), means (Q14,Q15) for supplying needed amounts of drain current to the first (J2) and second (J4) input JFETs, and means (Q11,D0,D1) for operating a separator JFET (J1) having a drain coupled to a source of the first input JFET (J2) and a source coupled to a source of the second input JFET (J4) to control an amount of electrical isolation between the drain and source of the separator JFET (J1) so as to limit an amount of reverse bias voltage across a gate-source junction of one of the first (J2) and second (J4) input JFETs to a value of less than a gate-source junction breakdown voltage of that one of the first (J2) and second (J4) input JFETs.

DETAILED DESCRIPTION OF THE PREFERRED EMBODIMENTS

Figure 1:
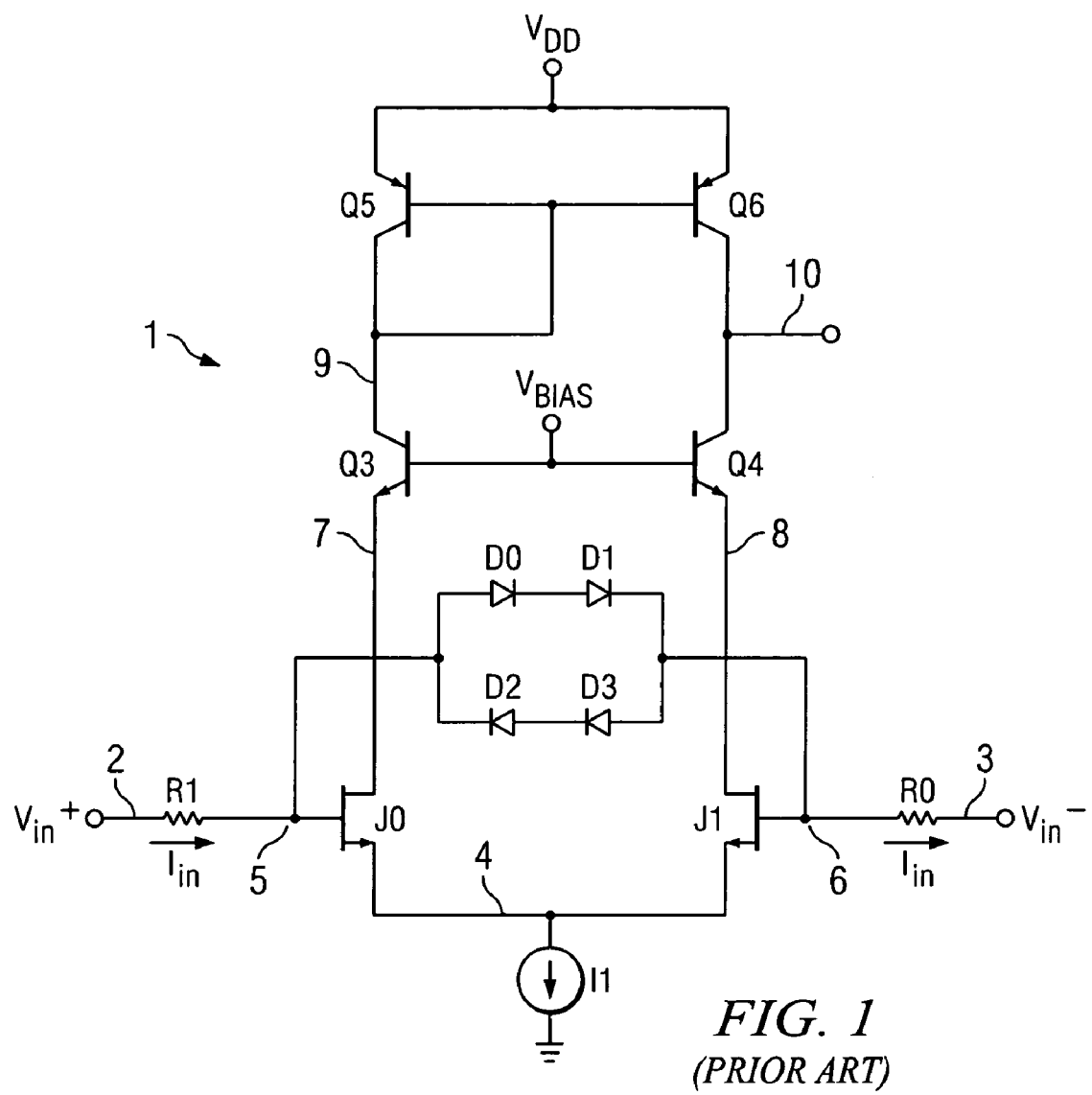
FIG. 1 is a schematic diagram of a typical amplifier input stage utilizing diode clamps to protect the input transistors.

To solve the above described problems of the prior art, the present invention provides a new design approach to utilize low voltage transistors as the differential input transistors of an amplifier input stage without using diode clamp protection for circuits as shown Prior Art in FIG. 1.

Figure 2:
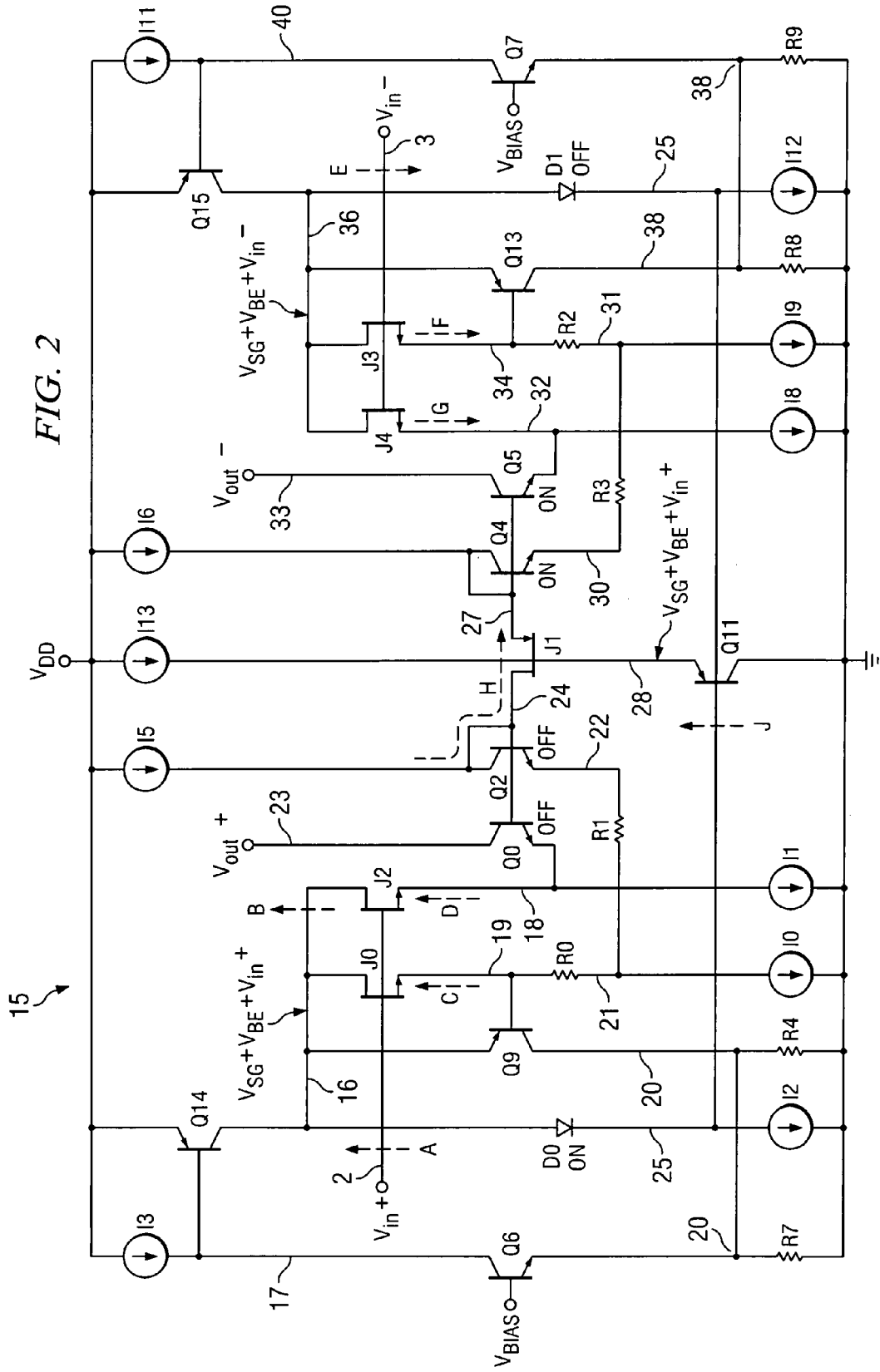
FIG. 2 is a schematic diagram of an input stage which provides circuitry for protecting low voltage input transistors against high differential input voltages in accordance with the present invention, without using diode clamps.

Referring to FIG. 2, high-voltage operational amplifier input stage 15 includes an input conductor 2 which applies input voltage Vin+ to the gates of low-voltage N-channel JFETs J0 and J2. The drains of JFETs J0 and J2 are connected by conductor 16 to the collector of a PNP transistor Q14 and to the anode of a diode D0.

The source of JFET J0 is connected by conductor 19 to the base of PNP transistor Q9, the emitter of which is connected to conductor 16. The collector of transistor Q9 is connected by conductor 20 to one terminal of each of resistors R4 and R7 and also to the emitter of an NPN transistor Q6. The other terminals of resistors R4 and R7 are connected to ground. Conductor 19 also is connected to one terminal of a resistor R0, the other terminal of which is connected by conductor 21 to one terminal of a current source I0. The other terminal of current source I0 is connected to ground. The cathode of diode D0 is connected by conductor 25 to one terminal of a current source I2, the other terminal of which is connected to ground. The collector of NPN transistor Q6 is connected by conductor 17 to the base of active current source transistor Q14 and to one terminal of a current source I3, the other terminal of which is connected to $V_{DD}$. The base of transistor Q6 is coupled to a suitable bias voltage $V_{BIAS}$.

The source of input JFET J2 is connected by conductor 18 to the emitter of an NPN transistor Q0 and to one terminal of a current source I1, the other terminal of which is connected to ground. The base of transistor Q0 is connected by conductor 24 to the base and collector of a diode-connected NPN transistor Q2 and to the drain of a P-channel separator JFET J1. The collector of transistor Q0 is connected to an output conductor 23 on which an output voltage Vout+ is produced. The emitter of transistor Q2 is connected by conductor 22 to one terminal of a resistor R1, the other terminal of which is connected to conductor 21. The base and collector of diode-connected transistor Q2 are connected to one terminal of a current source I5, the other terminal of which is connected to $V_{DD}$. Transistor Q2 operates to provide the base bias voltage of transistor Q0.

The left-hand portion of high-voltage operational amplifier input stage 15 of FIG. 2 described above is symmetrical to the subsequently described right-hand portion thereof. Specifically, the right-hand portion includes an input conductor 3 which applies input voltage Vin− to the gates of low-voltage N-channel JFETs J3 and J4. The drains of transistors J3 and J4 are connected by conductor 36 to the collector of a PNP transistor Q15 and to the anode of a diode D1.

The source of JFET J3 is connected by conductor 34 to the base of PNP transistor Q13, the emitter of which is connected to conductor 36 and the collector of which is connected by conductor 38 to one terminal of each of resistors R8 and R9 and also to the emitter of an NPN transistor Q7. The other terminals of resistors R8 and R9 are connected to ground. Conductor 34 also is connected to one terminal of a resistor R2, the other terminal of which is connected by conductor 31 to one terminal of a current source I9. The other terminal of current source I9 is connected to ground. The cathode of diode D1 is connected by conductor 25 to one terminal of a current source I12, the other terminal of which is connected to ground. The collector of NPN transistor Q7 is connected by conductor 40 to the base of transistor Q15 and to one terminal of a current source I11, the other terminal of which is connected to $V_{DD}$. The base of transistor Q7 is coupled to a suitable bias voltage $V_{BIAS}$.

The source of input JFET J4 is connected by conductor 32 to the emitter of an NPN transistor Q5 and to one terminal of a current source I8. The other terminal of current source I8 is connected to ground. The base of transistor Q5 is connected by conductor 27 to the base and collector of a diode-connected NPN transistor Q4 and to the source of P-channel separator JFET J1. The collector of transistor Q5 is connected to an output conductor 33 on which an output voltage Vout⁻ is produced. The emitter of diode-connected transistor Q4 is connected by conductor 30 to one terminal of a resistor R3, the other terminal of which is connected to conductor 31. The base and collector of diode-connected transistor Q4 is connected to one terminal of a current source I6, the other terminal of which is connected to $V_{DD}$.

A "maximum voltage level selector and level shift circuit" circuit, including PNP transistor Q11 and diodes D0 and D1, functions to control the gate of P-channel separator JFET J1 FIG. 2, and is generally similar to the various embodiments of the minimum voltage level selector and level shift circuits disclosed in the assignee's previously mentioned incorporated-by-reference pending parent patent application.

The gate of P-channel separator JFET J1 is connected by conductor 28 to one terminal of a current source I3 and to the emitter of a PNP level shift transistor Q11, the collector of which is connected to ground. The base of level shift transistor Q11 is connected to conductor 25. The other terminal of current source I13 is connected to $V_{DD}$. Diodes D0 and D1 are biased by current sources I2 and I12 respectively. Level shift transistor Q11 is biased by current source I13.

In the example of FIG. 2, N-channel JFETs J0, J2, J3 and J4 are low-threshold transistors which can be damaged when their gate-to-source, gate-to-drain or drain-to-source voltage exceeds, for example, approximately 10 volts. P-channel separator JFET J1 is a high-voltage transistor in which the gate-to-source, gate-to-drain or drain-to-source voltage can be as high as $V_{DD}$. The various NPN transistors and PNP transistors can be high-voltage transistors that can withstand collector-base voltages as high as $V_{DD}$, but cannot have emitter-to-base voltages greater than approximately 3 volts.

The maximum voltage level selector and level 12 shift circuit Q11,D0,D1 operates to cause separator JFET J1 to have very low channel resistance so that input JFETs J2 and J4 are to fully differentially coupled during normal balanced operation when the differential input voltage Vin⁺–Vin⁻ is very small.

Maximum voltage level selector and level shift circuit Q11, D0,D1 also operates to cause separator JFET J1 to go into its pinch-off region of operation if the differential input voltage Vin⁺–Vin⁻ is excessively large so as to cause gate-to-source breakdown of either of input JFETs J2 and J4. With separator JFET J1 in its pinch-off region, its source and drain electrodes are effectively separated, and most of the Vin⁺–Vin⁻ overvoltage is, in effect, absorbed across separator JFET J1 instead of across the gate-to-source junction of either of low-threshold input JFETs J2 and J4. Therefore, low-threshold input JFETs J2 and J4, with their superior high-speed performance characteristics, can be utilized because they are protected from damage that would otherwise be caused by the excessive differential Vin⁺–Vin⁻ input overvoltages.

In FIG. 2, the input differential pair consists of N-channel input JFETs J2 and J4, which function as voltage followers and are "followed" by NPN transistors Q0 and Q5. Transistors Q0 and Q5 function as common-base gain stages. Current sources I5 and I6 bias diode-connected NPN transistors Q2 and Q4 respectively. As a result, transistor Q2 sets the bias of transistor Q0, and transistor Q4 sets the bias of transistor Q5. JFET J0 is biased by the current difference between current sources I5 and I0, and similarly, JFET J3 is biased by the current difference between current sources I6 and I9. JFET J2 is biased by current source I1 in accordance with the W/L ratio (channel-width-to-channel-length ratio) of JFET J2 to that of JFET J0. Similarly, JFET J4 is biased by current source I8 in accordance with the W/L ratio (channel-width-to-channel-length ratio) of JFET J4 to that of JFET J3. By adjusting the W/L ratio, the Q0 and Q4 currents can be set to appropriate amounts, which is critical to amplifier performance. Furthermore, slew rate enhancement, which is described later, also depends on the W/L ratio. The drain-to-source voltages $V_{DS}$ of JFETs J0 and J2 are equal to the base-to-emitter voltage $V_{BE}$ voltage drop of transistor Q9. Similarly, the $V_{DS}$ voltages of JFETs J3 and J4 equal to the $V_{BE}$ voltage of transistor Q13.

The left and right sides of input stage 15 in FIG. 2 are symmetrical. During steady state operation, the source voltages of JFETs J0, J2, J3 and J4 are the same, and are biased at one $V_{SG}$ voltage higher than the gate voltage of those transistors. The base voltages of transistors Q0, Q2, Q4 and Q5, and also the drain and source voltages of J1, are equal and are biased at $V_{SG}+V_{BE}$ volts higher than the gate voltage of JFETs J0, J2, J3 and J4. Separator JFET J1 needs to have a minimum drain-to-source resistance, i.e., channel resistance Rds in order to minimize its noise contribution, so its gate should be biased at the same voltage as its drain and source, which both are $V_{SG}+V_{BE}$ volts higher than its gate voltage. This is accomplished by maximum voltage level selector and level shift circuit Q11,D0,D1.

Transistor Q14, along with the local feedback loop consisting of current source I3, transistors Q6 and Q9, and resistors R4 and R7, serves as an active current source and provides current as needed to JFET J0 and input JFET J2 during slewing operation of input stage 15 when Vin⁺ increases. Since only one Vsat (drain-to-source saturation voltage) of the "head room voltage" is required in order to allow normal operation of active current source transistor Q14, active current source transistor Q14 also maximizes the input common-mode range.

When the (+) input signal Vin⁺ increases as indicated by dashed line arrow A, the source voltages of JFET J0 and input JFET J2, as well as the emitter voltages of transistors Q0 and Q2, track Vin⁺ at a voltage which is one $V_{SG}$ level higher than Vin⁺. The anode of diode D0 also tracks Vin⁺ to reach a high voltage level (as indicated by dashed line arrow B), while the anode (conductor 36) of diode D1 tracks the (–) input Vin⁻ and stays at a relatively low level. Therefore, diode D0 stays turned on to conduct currents I2 and I12, and diode D1 is reverse biased (i.e. turned off). As a result, the gate voltage of separator JFET J1 tracks the increasing Vin⁺ voltage level with a corresponding voltage level shift (i.e., the $V_{BE}$ of level shift transistor Q11) and separator JFET J1 stays strongly turned on to conduct the current I5. Transistors Q0 and Q2 are turned off as their emitter voltages increase, and current I5 flows through separator JFET J1 as indicated by dashed line arrow H.

Also for the foregoing case of increasing Vin⁺, in the right half of input stage 15, transistor Q4 conducts both currents I5 and I6. Current 19 is chosen to be greater than the total amount of currents I5 and I6 and the current difference between I5 and I6 flows though JFET J3. The source potential of JFET J3 is biased by this current difference. Therefore, even though the (−) input signal Vin⁻ of input stage 15 is at a relatively low voltage level as indicated by dashed line arrow E, JFET J3 does not turn off as much as JFET J4 and the source voltages of JFET J3 and input JFET J4 track the inverting input signal Vin⁻, and still conducts current as indicated by dashed line arrows F and G.

In the case of increasing Vin⁻, transistor Q15, along with the local feedback loop consisting of current source I11, transistors Q7 and Q13, and resistors R8 and R9, serves as an active current source and provides current as needed to JFET J3 and input JFET J4 during slewing operation of input stage 15 when Vin⁻ increases. Active current source transistor Q15 maximizes the input common-mode range, since only one Vsat (drain-to-source saturation voltage) of head room voltage is needed to allow normal operation of active current source transistor Q15. As the (−) input signal Vin⁻ increases, the source voltages of JFET J3 and input JFET J4, as well as the emitter voltages of transistors Q5 and Q4, track Vin⁻ at a voltage which is one $V_{SG}$ level higher than Vin⁻. The anode of diode D1 also tracks Vin to reach a high voltage level, while the anode of diode D0 tracks the (+) input Vin⁺ and stays at a relatively low level. Therefore, diode D1 stays turned on to conduct currents I2 and I12 and diode D0 is turned off. As a result, the gate voltage of separator JFET J1 tracks the increasing Vin⁻ voltage level with a corresponding voltage shift (i.e., the $V_{BE}$ of level shift transistor Q11) and separator JFET J1 stays strongly turned on to conduct the current I6. Transistors Q5 and Q4 are turned off as their emitter voltages increase.

For the case of increasing Vin⁻, the left half of input stage 15, transistor Q2 conducts both currents I5 and I6. Current I0 is chosen to be greater than the total amount of currents I5 and I6 and the current difference between I5 and I6 flows though JFET J0. The source potential of JFET J0 is biased by this current difference. Therefore, even though the (+) input signal Vin⁺ of input stage 15 is at a relatively low voltage level, JFET J0 does not turn off as much as input JFET J2 and the source voltages of JFET J0 and input JFET J2 track the non-inverting input signal Vin⁺.

When a positive high voltage differential input signal Vin⁺–Vin⁻ is applied during a dynamic operating condition, the gate of P-channel separator JFET J1 always tracks the highest potential of the input signal Vin⁺ and P-channel separator JFET J1 stays turned on to conduct the current I5. The drain or source of P-channel separator JFET J1 receives high or low voltage, respectively, so the source-coupled differential input JFETs J2 and J4 are electrically separated. Therefore, bipolar transistors Q0, Q2, Q4 and Q5 are protected from large reverse-bias voltages and JFETs J0, J2, J3 and J4 are protected from high reverse gate-source voltages and operate without being damaged because separator JFET J1 is biased into its pinch-off region in response to differential input overvoltages that otherwise could damage JFETs J0, J2, J3 and J4. Separator JFET J1 is properly sized so as to reduce its noise contribution.

Similarly, when a negative value of high voltage differential input signal Vin⁺–Vin⁻ is applied during a dynamic operating condition, the gate of P-channel separator JFET J1 always tracks the highest potential of the input signal Vin⁻ and separator JFET J1 stays turned on to conduct the current I6. Therefore, the drain or source of separator JFET J1 receives high or low voltage, respectively, and accordingly goes into its pinch-off region, causing the differential JFETs J2 and J4 to be effectively separated. Therefore transistors Q0, Q2, Q4 and Q5 are protected from large reverse emitter-base voltages and JFETs J0, J2, J3 and J4 are protected from high reverse gate-source voltages and operate without being damaged.

The slew rate of input stage 15 is usually limited by the input stage tail currents I1 and I8 and compensation capacitance is (not shown) for a typical amplifier design. To increase the slew rate, additional slew-boost current I1 is provided as follows.

During slewing, current sources I1 and I8 stay constant, and the current flowing through transistor Q0 or transistor Q5 determines the slew rate. During operation when substantial slewing is not occurring, only a small portion of current I1 or I8 flows through transistor Q0 or Q5, respectively. However, during slewing, the circuitry including input JFET J2, transistor Q0, and current source I1 operates to cause a larger portion of current I1 to flow through transistor Q0 when Vin⁺ causes the amount of current through input JFET J2 to decrease substantially. Similarly, the during slewing, the circuitry including input JFET J4, transistor Q5, and current source I8 operate to cause a larger portion of current I8 to flow through transistor Q5 when Vin⁻ causes the amount of current through input JFET J4 to decrease substantially. In either case, the total supply current of input stage 15 is not increased during slewing operation.

In the input stage 15, the slew rate is proportional to the amount of current flowing through transistor Q0 or transistor Q5 under dynamic operating conditions. When resistors R0, R1, R2 and R3 are properly sized and device size ratios of transistors J0 and J2 and input JFETs J3 and J4 are selected as needed, the current provided by I1 or I8 and conducted by transistor Q0 or Q5 during the slewing is substantially increased. Thus, the effective amount of "tail" current I1 or I8 flowing through transistor Q0 or Q5 to provide slewing is boosted during the slewing, and as a result the slew rate of input stage 15 can be substantially increased. The implementation of slew rate enhancement is simple, which is a benefit of the input stage design shown in FIG. 2, and provides more flexibility in the design of high performance amplifiers.

The input stage of the present invention can be used to provide a high-voltage operational amplifier with N-channel JFET input transistors which is fully functionally at high differential input voltages even though the N-channel JFET input transistors are low-voltage devices. The input stage of the present invention protects the low voltage N-channel JFETs from breaking down under different operational conditions. The performance of the operational amplifier is not substantially degraded in comparison with the case in which conventional high-voltage N-channel input JFETs are used. Slew rate enhancement is achieved by means of very simple circuitry.

Transistor Q14 in conjunction with transistors Q9 and Q6 and resistors R4 and R7 (also transistor Q15 in conjunction with transistors Q13 and Q7, and resistors R8 and R9) serve as active current sources to maximize the upper common-mode range of amplifier input stage 15. The use of additional JFET J0 and resistors R0 and R1 (and also JFET J3 and resistors R2 and R3) provide a simple way of enhancing the slew rate when needed. The input stage design with JFETs J2 and J4 and transistors Q0 and Q5 allows the lower common-mode range of amplifier input stage 15 to include the negative power supply voltage.

The invention provides a high-voltage amplifier input stage utilizing low voltage input transistors without using diode clamps, uses an input stage design to maximize the input common-mode range of the amplifier input stage, and uses simple circuitry to provide increased slew rate. The combination of these features is important to the performance of amplifier input stage 15, and can not be achieved by known amplifier input stage designs.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the design technique of the present invention is also applicable to various other high voltage amplifier input stage designs where low voltage input transistors are needed to achieve the desired performance.

What is claimed is:

1. An input stage comprising:
    (a) differentially coupled first and second input JFETs (junction field-effect transistors), a gate of the first input JFET being coupled to receive a first input signal and a gate of the second input JFET being coupled to receive a second input signal;
    (b) a first active current source transistor coupled between a first reference voltage and a drain of the first input JFET, and a second active current source transistor coupled between the first reference voltage and a drain of the second input JFET;
    (c) a separator JFET having a drain coupled to a source of the first input JFET and a source coupled to a source of the second input JFET;
    (d) a control circuit having a first input coupled to the drain of the first input JFET, a second input coupled to the drain of the second input JFET, and an output coupled to a gate of the separator JFET for controlling the separator JFET in response to the first and second input signals so as to limit a reverse bias voltage across a gate-source junction of one of the first and second input JFETs; and
    (e) bias current circuitry coupled to bias the first and second input JFETs, respectively.

2. The input stage of claim 1 wherein the control circuit includes a first diode having an anode coupled to the drain of the first input JFET and a cathode coupled to a base of a level shift transistor having an emitter coupled to the gate of the separator JFET, and a second diode having an anode coupled to the drain of the second input JFET and a cathode coupled to the base of the level shift transistor.

3. The input stage of claim 2 wherein the first and second input JFETs are low-voltage JFETs having gate-source breakdown voltages which are less than a predetermined maximum magnitude of a difference between the first input signal and the second input signal.

4. The input stage of claim 3 including a first transistor having an emitter coupled to the source of the first input JFET, a base coupled to the drain of the separator JFET, and a collector coupled to conduct a first output signal, a second transistor having an emitter coupled to the source of the second input JFET, a base coupled to the source of the separator JFET, and a collector coupled to conduct a second output signal, a first current source in the bias current circuitry coupled between the source of the first input JFET and a second reference voltage, and a second current source in the bias current circuitry coupled between the source of the second input JFET and the second reference voltage.

5. The input stage of claim 4 including a first JFET having a gate and a drain coupled to the gate and drain, respectively, of the first input JFET, a second JFET having a gate and a drain coupled to the gate and drain, respectively, of the second input JFET, a third transistor having a base and collector coupled to the drain of the separator JFET and to a third current source and an emitter coupled to a source of the first JFET, and a fourth transistor having a base and collector coupled to the source of the separator JFET and to a fourth current source and an emitter coupled to a source of the second JFET.

6. The input stage of claim 5 including a fifth transistor having an emitter coupled to the drain of the first JFET and a base coupled to the source of the first JFET for maintaining the drain of the first JFET and the drain of the first input JFET at a voltage that is one base-emitter voltage plus one source-gate voltage different from the first input voltage, and also including a sixth transistor having an emitter coupled to the drain of the second JFET and a base coupled to the source of the second JFET for maintaining the drains of the second JFET and the second input JFET at a voltage that is one base-emitter voltage plus one gate-source voltage different from the second input voltage.

7. The input stage of claim 6 including a seventh transistor having a collector coupled to a base of the first active current source transistor and to a fifth current source, and an emitter coupled to a collector of the fifth transistor and to one terminal of a first resistor, and also including an eighth transistor having a collector coupled to a base of the second active current source transistor, to a sixth current source, and an emitter coupled to a collector of the sixth transistor and to one terminal of a second resistor.

8. The input stage of claim 7 wherein the source of the first JFET is coupled by means of a third resistor to a fifth current source and to a first terminal of a fourth resistor having a second terminal coupled to an emitter of the third transistor, and wherein the source of the second JFET is coupled by means of a fifth resistor to a sixth current source and to a first terminal of a sixth resistor having a second terminal coupled to an emitter of the fourth transistor.

9. The input stage of claim 8 wherein the first and second input JFETs are N-channel JFETs.

10. The input stage of claim 9 wherein the first, second, third, and fourth transistors are NPN transistors.

11. The input stage of claim 9 wherein the fifth and sixth transistors are PNP transistors.

12. The input stage of claim 9 wherein the first and second active current source transistors are PNP transistors.

13. The input stage of claim 9 wherein the seventh and eighth transistors are NPN transistors.

14. The input stage of claim 9 wherein the first and second JFETs are high-voltage JFETs.

15. The input stage of claim 9 wherein the first through the eighth transistors have emitter-base breakdown voltages of no more than approximately 3 volts.

16. A method for preventing damage to differentially coupled input JFETs in an integrated circuit amplifier, the method comprising:
    (a) providing first and second differentially coupled input JFETs;
    (b) applying a first input signal to a gate of the first input JFET, and applying a second input signal to a gate of the second input JFET;
    (c) supplying needed amounts of drain current to the first and second input JFETs; and
    (d) operating a separator JFET having a drain coupled to a source of the first input JFET and a source coupled to a source of the second input JFET to control an amount of electrical isolation between the drain and source of the separator JFET so as to limit an amount of reverse bias voltage across a gate-source junction of one of the first and second input JFETs to a value of less than a gate-source junction breakdown voltage of that one of the first and second input JFETs;

(e) providing:

a first transistor having an emitter coupled to the source of the first input JFET, a base coupled to the drain of the separator JFET, and a collector coupled to conduct a first output signal, a second transistor having an emitter coupled to the source of the second input JFET, a base coupled to the source of the separator JFET, and a collector coupled to conduct a second output signal, a first current source coupled between the source of the first input JFET and a second reference voltage, and a second current source coupled between the source of the second input JFET and the second reference voltage, and operating the first and second input JFETs, the first and second transistors, the first and second current sources:

so as to cause a larger portion of current of the first current source to flow through the first transistor when the first input signal causes in amount of current through the first input JFET to decrease substantially; and so as to cause a larger portion of current of the second current source to flow through the second transistor when the second input signal causes in amount of current through the second input JFET to decrease substantially;

to thereby provide slew boosting in the integrated circuit amplifier.

17. The method of claim 16 including coupling the base of the first transistor to the drain of the separator JFET and coupling the base of the second transistor to the source of the separator JFET.

18. The method of claim 16 step (c) includes providing a first active current source transistor coupled between a first reference voltage and a drain of the first input JFET, and a second active current source transistor coupled between the first reference voltage and a drain of the second input JFET, and controlling amounts of current flowing through the first and second active current source transistors in response to amounts of current flowing in the first and second input JFETs, respectively.

* * * * *